TRANSISTOR AMPLIFIER WITH OVERLOAD PROTECTION

Filed July 2, 1956

INVENTOR.
JOHN B. SCHULTZ
BY [signature]
ATTORNEY

United States Patent Office 2,860,196

Patented Nov. 11, 1958

2,860,196

TRANSISTOR AMPLIFIER WITH OVERLOAD PROTECTION

John B. Schultz, Glenolden, Pa., assignor to Radio Corporation of America, a corporation of Delaware Application July 2, 1956, Serial No. 595,176

2 Claims. (Cl. 179—171)

This invention relates to signal receiving systems utilizing transistors as signal translating and amplifying means.

It is the object of the present invention to provide improved circuit means for preventing the overloading of a radio receiver transistor signal amplifying stage and to enable satisfactory operation without appreciable distortion despite the reception of very strong signals.

Overloading of a transistor radio receiver is prevented, in accordance with the invention, by connecting a unilateral conducting element such as a crystal diode between the output circuit of a transistor amplifier stage and a further point on the circuit, the potential difference between the output circuit and the further point on the circuit being such as the diode is normally biased in the reverse direction and is nonconductive. The diode conducts when the amplitude of the output signal from the transistor amplifier is great enough to overcome the reverse bias. When this occurs, the diode provides low circuit impedance and a portion of the signal energy is dissipated across it, thus preventing overloading of the following stage, or stages, due to the reception of strong signals.

Figure 1:
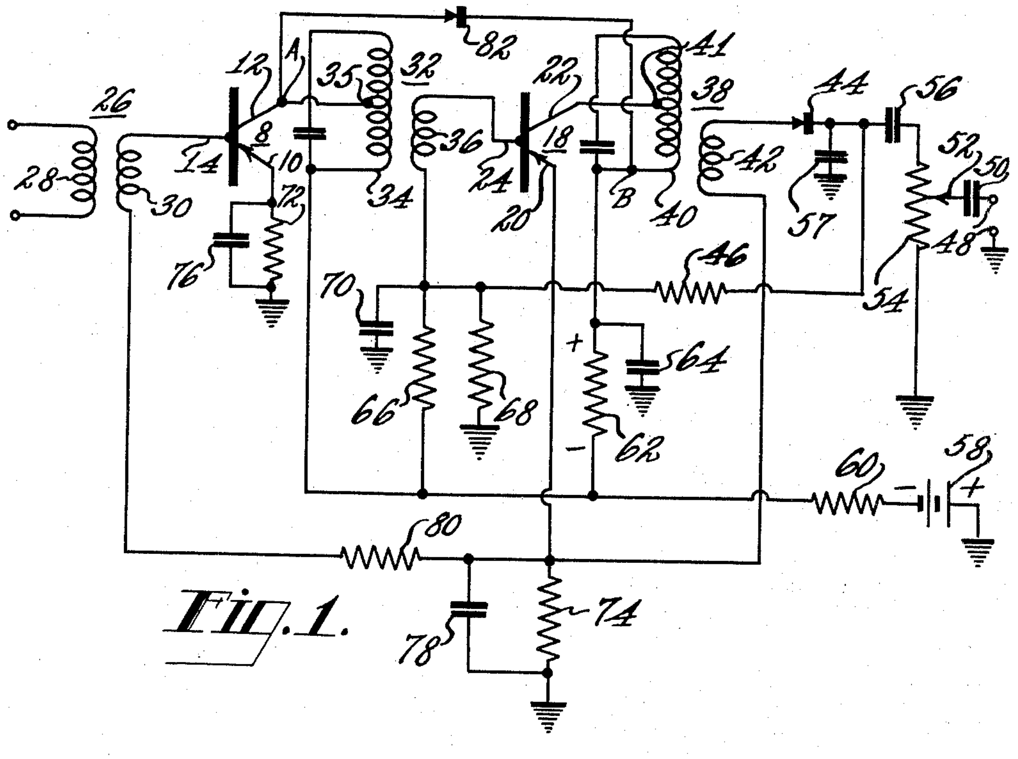
Figure 2:
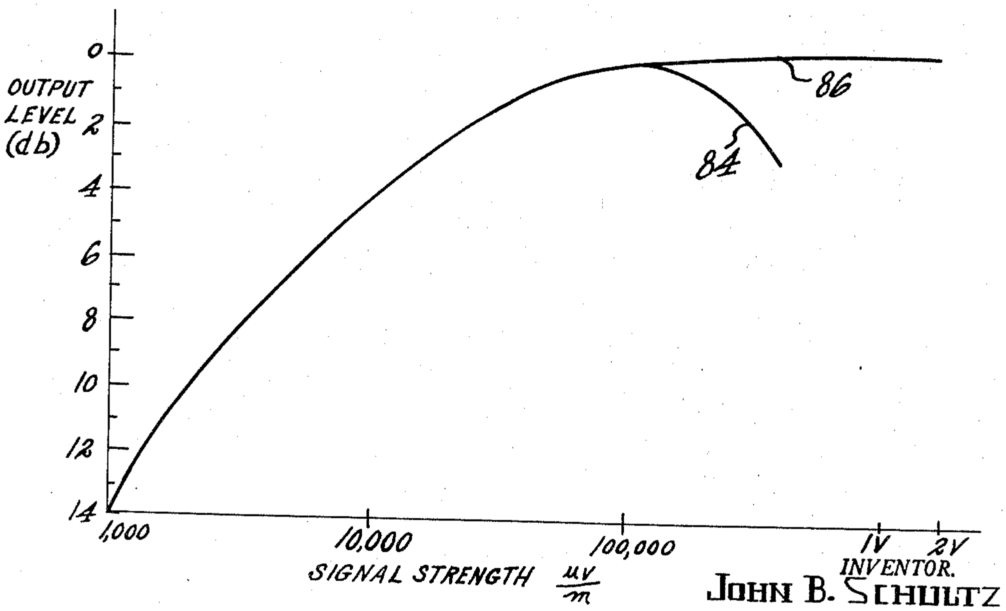

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a portion of the transistor signal amplifying stages of a radio signal receiving system embodying the invention; and Figure 2 is a graph showing certain characteristics of a circuit of the type illustrated in Figure 1.

Referring now to the drawing and in particular to Figure 1, a pair of cascade connected signal amplifying stages include a first stage transistor 8 and a second stage transistor 18. The transistors 8 and 18 may be, for example, the intermediate frequency (I. F.) signal amplifying stages of a superheterodyne signal receiving system and may be considered to be junction transistors of the P–N–P type. It should be understood, however, that transistors of P type conductivity, N–P–N junction transistors, for example, could be used if the polarity of the biasing voltages were reversed. The transistors 8 and 18 include respective emitter electrodes 10 and 20, collector electrodes 12 and 22, and base electrodes 14 and 24.

Input signals are applied to the first transistor 8 through an input transformer 26 having a primary winding 28, and a secondary winding 30 one end of which is connected directly with the base 14 of the first transistor 8. Output signals are derived from the collector electrode 12 of the first transistor 8 and are applied through a tuned output transformer 32 to the base 24 of the second transistor 18. The transformer 32 includes a primary winding 34, having an intermediate tap 35 which is connected with the collector 12 of the first transistor 8. The tap point 35 is selected so that the impedance of the output circuit is lower than the output impedance of the transistor. By this expedient, neutralizing networks are not required. One end of the secondary winding 36 is connected directly with the base 24 of the second transistor 18. Amplified output signals are derived from the collector 22 of the second transistor 18 and applied through a tuned output transformer 38 to a crystal diode detector and A. G. C. source 44.

The transformer 38 includes a primary winding 40 having an intermediate tap 41 which is connected with the collector 22 of the second transistor 18. This tap is also selected so that the impedance of the output circuit is lower than the output impedance of the transistor. The cathode of the diode detector 44 is connected through a resistor 46 and the secondary winding 36 of the coupling transformer 32 to the base 24 of the second transistor 18. The anode of the diode detector 44 is connected through the secondary winding 42 of the output transformer 38 to the emitter 20 of the second transistor 18. The diode 44 is operative to provide an A. G. C. voltage which is applied directly between the base 24 and the emitter 20 of the second transistor 18, thus reducing the gain of this transistor as the signal strength increases. It is noted that the diode detector 44 is poled for forward conduction in a direction opposite to normal base-emitter current flow of the transistor 18, and its polarity would be reversed if transistors of P type conductivity were used.

Output signals are derived from the circuit from a pair of output terminals 48, one of which is grounded. The ungrounded output terminal 48 is connected through a coupling capacitor 50 to the variable tap 52 of a volume control resistor 54. The high voltage end of the volume control resistor 54 is connected through a coupling capacitor 56 to the cathode of the diode detector 44 and the other end of the volume-control resistor 54 is returned to ground.

To supply operating biasing potentials for the transistors 8 and 18, and for the diode detector 44, a direct-current supply source such as a battery 58 is provided, the positive terminal of which is grounded. The negative terminal of the battery 58 is connected through a resistor 60 and the lower half of the primary winding 34 of the interstage coupling transformer 32 to the collector 12 of the first transistor 8, and through the resistor 60, a decoupling resistor 62, and the lower half of the primary winding 40 of the output transformer 38 to the collector 22 of the second transistor 18. The resistors 60 and 62 and the battery 58 are by-passed for signal frequencies by a by-pass capacitor 64. The base 24 of the second transistor is connected through the secondary winding 36 and the resistors 66 and 60 to the negative terminal of the battery 58. A biasing resistor 68 is connected from the junction of the A. G. C. filter resistor 46 and the resistor 66 to ground, and a filter capacitor 70 is connected from the junction of the secondary winding 36 and the resistor 66 to ground.

To provide negative current feedback for the transistors 8 and 18 for stabilizing their operating point, each of the emitter electrodes 10 and 20 is connected to ground through respective stabilizing resistors 72 and 74. The resistors 72 and 74 are by-passed by the capacitors 76 and 78, respectively. The base 14 of the first transistor 8 is connected through a resistor 80 to the junction of the emitter electrode 20 and the stabilizing resistor 74.

To prevent overloading of the circuit in accordance with the invention, a unilateral conducting element is connected from the output circuit of the transistor amplifier which immediately precedes the stage or stages in which it is desired to prevent an overload condition to a point in the circuit such that the unilateral conducting element is normally biased in the reverse direction. In the embodiment of the invention illustrated, a diode 82 is connected from the output circuit or the collector electrode of the first transistor 8 (point A) to the junction of the primary winding 40 of the output transformer 38 and the decoupling resistor 62 (point B). The diode 82 is poled in the circuit such that it is normally biased in the reverse direction and is nonconductive, thereby having no effect on the circuit operation under normal conditions. Under normal operating conditions, collector current flow through the decoupling resistor 62 provides a voltage drop such that the point B is at a positive potential relative to the point A. Accordingly, the diode 82 is biased in the reverse or nonconducting direction. It is to be noted that the diode 82 is poled for forward conduction in the same direction as normal collector current flow of the transistor 8, which is out of the collector 12.

The collector current flow of the transistor 18 is relatively constant (approximately 1.0 milliampere to 0.7 milliampere from zero signal to strong signal, respectively) over the normal range of input signal strength. For this reason, the amount of reverse bias on the diode 82 is relatively constant despite normal changes in signal strength and the diode 82 will have no effect on the circuit operation over the normal range of received signals (0 to 100,000 microvolts per meter). For signals above this normal range, however, and for signal strengths which would normally cause overloading of the second transistor I. F. amplifier 18, the diode 82 becomes conductive. This occurs when the peak positive signal voltage swing on the collector electrode 12 (point A) of the first transistor 8 is of sufficient amplitude to overcome the normal reverse bias on the diode 82. When the diode 82 is rendered conductive, its impedance decreases and a predetermined amount of the signal energy is dissipated by the low impedance shunt signal path it provides in the amplifier. Accordingly, the excess signal is prevented from flowing through the output circuit and overloading the transistor 18, and a substantially distortion free output signal is obtained. This is illustrated graphically in Figure 2, where output level in decibels is plotted against signal strength in microvolts per meter on a logarithmic scale. Without the diode 82 connected as described, distortion due to overloading will normally occur at input signal strengths of 100,000 microvolts per meter as shown by the curve 84. With the diode 82 connected as shown and described, however, the output level remains substantially constant despite increases in the amount of the received signal as shown by the curve 86.

While it will be understood that the circuit specification may vary according to the design for any particular application, the following specifications are included by way of example:

| | |
|---|---|
| Transistors 8 and 18 | Commercial type 2N139. |
| Diodes 44 and 82 | Commercial type 1N295. |
| Battery 58 | 9 volts. |
| Resistors 54; 60; 62; 66; 68; 72; 74; and 80. | 2,000; 100; 470; 15,000; 15,000; 3,300; 3,900; and 1,000 ohms respectively. |
| Capacitors 50, 56, 57, 64, 70, 76, and 78. | 10, 10, .03, .1, 10, .1, and 45 microfarads respectively. |

Radio signal receiving circuits embodying the invention, and constructed in accordance with the above specifications, provide a reliable and effective means for eliminating the overloading of the signal amplifying portions of a radio receiver.

What is claimed is:

1. In a radio signal receiving system, the combination comprising, a first transistor intermediate-frequency signal amplifier device having a first base, a first emitter, and a first collector electrode, a second transistor intermediate-frequency signal amplifier device having a second base, a second emitter, and a second collector electrode, signal input means connected for applying an intermediate-frequency input signal between said first base and first emitter electrodes, tuned signal coupling means connected for deriving an amplified intermediate-frequency signal from said first collector electrode and for applying said amplified signal between said second base and second emitter electrodes, output circuit means connected for deriving an output signal from said second collector electrode, means providing a direct-current supply source for said devices, means connecting said first collector electrode with said source, means including a portion of said output circuit means and a resistor serially connecting said second collector electrode with said source, and a diode direct-current conductively connected directly between said first collector electrode and a point intermediate said output circuit means and said resistor, said resistor having a resistance value such that normal collector current flow of said second transistor therethrough provides a potential difference between said first collector electrode and said intermediate point of a magnitude and polarity to reverse bias said diode over the normal signal amplitude variation range of said receiver, said diode being forward biased in response to peak output signal voltage on said first collector electrode of a predetermined amplitude above said range to render said diode conductive and provide a low impedance shunt signal path for preventing overloading of said second transistor intermediate-frequency amplifier.

2. In a signal receiving system, the combination comprising, a first transistor having a first base, a first emitter, and a first collector electrode, a second transistor having a second base, a second emitter, and a second collector electrode, signal input means connected for applying an input signal between said first base and first emitter electrodes, signal coupling means including a first transformer connected for deriving an amplified signal from said first collector electrode and for applying said amplified signal between said second base and second emitter electrodes, an output circuit including a second transformer having a primary and a secondary winding connected for deriving an output signal from said second collector electrode, means providing a source of biasing potential for said transistors including a pair of terminals, means connecting the emitter electrodes of said transistors with one terminal of said source, means connecting said first collector electrode with the other terminal of said source, means including at least a portion of said primary winding and a resistor connecting said second collector wtih said other terminal of said source, and a diode connected from the junction of said primary winding and said resistor directly to said first collector electrode and poled in said system to be reverse biased by the potential across said resistor due to collector current flow of said second transistor over the normal signal range of said receiver and forward biased in response to peak collector output signal voltage of said first transistor of a predetermined amplitude above said normal range to provide a low impedance signal path for preventing signal overloading of said second transistor.

References Cited in the file of this patent

UNITED STATES PATENTS

| | | |
|---|---|---|
| 2,603,708 | Anger | July 15, 1952 |
| 2,669,654 | Maggio | Feb. 16, 1954 |
| 2,774,866 | Burger | Dec. 18, 1956 |

OTHER REFERENCES

Shea: "Principles of Transistor Circuits," pp. 434, 435, Sept. 1953.

Freedman et al.: "Experimental Transistors," Proc. IRE, June 1955, pp. 671–675.